United States Patent
Stauffer et al.

(10) Patent No.: US 9,853,524 B2
(45) Date of Patent: Dec. 26, 2017

(54) MOTOR AND CONTROLLER WITH ISOLATION MEMBERS BETWEEN ELECTRICAL COMPONENTS AND ASSOCIATED METHOD

(71) Applicant: Regal Beloit America, Inc., Beloit, WI (US)

(72) Inventors: Zachary Joseph Stauffer, Fort Wayne, IN (US); Mark Lyon Klopp, Berne, IN (US); Peter B Lytle, Fort Wayne, IN (US); Robert H Steffen, Decatur, IN (US)

(73) Assignee: Regal Beloit America, Inc., Beloit, WI (US)

( * ) Notice: Subject to any disclaimer, the term of this patent is extended or adjusted under 35 U.S.C. 154(b) by 563 days.

(21) Appl. No.: 14/445,447

(22) Filed: Jul. 29, 2014

(65) Prior Publication Data
US 2016/0036302 A1 Feb. 4, 2016

(51) Int. Cl.
H02K 11/00 (2016.01)
H02K 23/66 (2006.01)
H02K 7/10 (2006.01)
H02K 15/00 (2006.01)
H05K 1/02 (2006.01)
H02K 11/33 (2016.01)

(52) U.S. Cl.
CPC ..... H02K 11/0005 (2013.01); H02K 11/0073 (2013.01); H02K 11/33 (2016.01); H05K 1/0256 (2013.01); H05K 2201/10015 (2013.01)

(58) Field of Classification Search
CPC .................. H02K 7/14; H02K 11/33
USPC ....... 310/68 A, 68 D, 72, 75 R, 98, 109, 110
See application file for complete search history.

(56) References Cited

U.S. PATENT DOCUMENTS

| 3,262,031 | A | * | 7/1966 | Schaeffer | H01G 4/28 174/140 R |
|---|---|---|---|---|---|
| 3,423,558 | A | | 1/1969 | Brennen | |
| 3,423,560 | A | | 1/1969 | Brennen | |
| 5,844,770 | A | | 12/1998 | Fries-Carr et al. | |
| 6,147,869 | A | | 11/2000 | Furnival | |
| 6,972,972 | B2 | | 12/2005 | Duncan et al. | |
| 7,088,711 | B2 | | 8/2006 | Goergen et al. | |
| 8,026,450 | B2 | | 9/2011 | Goergen | |
| 2008/0030968 | A1 | * | 2/2008 | Mashino | H01G 4/38 361/767 |
| 2008/0112132 | A1 | | 5/2008 | Ehler | |

(Continued)

FOREIGN PATENT DOCUMENTS

JP 2007227957 A 9/2007
JP 2010027877 A 7/2008

Primary Examiner — Jose Gonzalez Quinones
(74) Attorney, Agent, or Firm — John Wagley (57) ABSTRACT

An electric machine is provided. The electric machine includes a stator having an electromagnetic coil and a rotor. The rotor is configured to rotate relative to the stator. The electric machine further includes a controller. The controller is adapted to control the electromagnetic coil. The controller includes a plurality of electrical components and an isolation member. The isolation member includes a first portion positioned in a first direction between two adjacent electrical components of the plurality of electrical components and a second portion positioned in a second direction normal to the first direction.

16 Claims, 11 Drawing Sheets

(56) References Cited

U.S. PATENT DOCUMENTS

2011/0069466 A1* 3/2011 Herron ................. H02M 7/003
                                                              361/803
2014/0035445 A1* 2/2014 Uryu ...................... H02K 11/33
                                                              310/68 D

* cited by examiner

MOTOR AND CONTROLLER WITH ISOLATION MEMBERS BETWEEN ELECTRICAL COMPONENTS AND ASSOCIATED METHOD

BACKGROUND OF THE INVENTION

The embodiments described herein relate generally to an electric machine, and more specifically, to an electric machine with closely packed electronic components.

An electric machine is typically in the form of an electric generator or an electric motor. The machine typically has a centrally located shaft that rotates relative to the machine. Electrical energy applied to coils within the machine initiates this relative motion which transfers the power to the shaft and, alternatively, mechanical energy from the relative motion of the generator excites electrical energy into the coils. For expediency, the machine will be described hereinafter as a motor. It should be appreciated that a machine may operate as a generator and vice versa.

A stationary assembly, also referred to as a stator, includes a stator core and coils or windings positioned around portions of the stator core. It is these coils to which energy is applied to initiate this relative motion which transfers the power to the shaft. These coils are formed by winding wire, typically copper, aluminum or a combination thereof, about a central core to form the winding or coil. An electric current is directed through the coils which induces a magnetic field. It is the magnetic field that initiates this relative motion which transfers the power to the shaft.

Many modern electric machines include a control, for controlling the motor. The control may control the speed and direction of the motor by, for example, controlling the electrical energy going to the coils. The control typically includes a plurality of electrical components.

The electric machine typically includes a housing for containing and supporting the stator. While the electrical components may be positioned in a separate control, spaced from the housing of the electric machine, typically, to reduce cost, to reduce space requirements or for other reasons, at least a portion of the electrical components are positioned within the electric machine housing.

Typically, to reduce cost, to reduce space requirements or for other reasons, the electric components are positioned as close as possible to each other, whether positioned inside the electric machine housing or in a separate control housing. Minimum spacings between adjacent electrical components are required for a variety of factors and the minimum spacings are regulated by a variety of industry and governmental agencies. The required minimum spacings and the number of components in the electric machine limit the minimize size of the housing for a given electric machine output capacity. Reducing these minimum spacings is desirable.

The present invention is directed to alleviate at least some of the problems with the prior art.

BRIEF DESCRIPTION OF THE INVENTION

According to an embodiment of the present invention, an electric machine is provided. The electric machine includes a stator having an electromagnetic coil and a rotor. The rotor is configured to rotate relative to the stator. The electric machine further includes a controller. The controller is adapted to control the electromagnetic coil. The controller includes a plurality of electrical components and an isolation member. The isolation member includes a first portion positioned in a first direction between two adjacent electrical components of the plurality of electrical components and a second portion positioned in a second direction normal to the first direction.

According to an aspect of the present invention, the electric machine may be provided whereby the second portion enables the minimum distance between the two adjacent electrical components of the plurality of electrical components be made less.

According to another aspect of the present invention, the electric machine may be provided wherein the two adjacent electrical components of the plurality of electrical components are bulk capacitors.

According to another aspect of the present invention, the electric machine may be provided wherein the electric machine further includes a circuit board, wherein the two adjacent electrical components of the plurality of electrical components are positioned above one surface of the circuit board, and wherein the second portion is positioned between the two adjacent electrical components and the circuit board.

According to another aspect of the present invention, the electric machine may be provided wherein the electric machine further includes a circuit board, wherein the two adjacent electrical components of the plurality of electrical components are positioned above one surface of the circuit board, and wherein at least a portion of the second portion is position adjacent the two adjacent electrical components of the plurality of electrical components and between the circuit board and the adjacent electrical components.

According to another aspect of the present invention, the electric machine may be provided wherein the electric machine further includes a circuit board, wherein the two adjacent electrical components of the plurality of electrical components are positioned above one surface of the circuit board, and wherein at least a portion of the second portion is position adjacent the two adjacent electrical components of the plurality of electrical components and opposed to the one surface of the circuit board.

According to another aspect of the present invention, the electric machine may be provided wherein the isolation member is integral.

According to another aspect of the present invention, the electric machine may be provided wherein the isolation member comprises electrically isolating tape.

According to another aspect of the present invention, the electric machine may be provided wherein the isolation member comprises at least one of tape, sleeving, and mylar.

According to another aspect of the present invention, the electric machine may be provided wherein the electric machine further includes a circuit board and wherein the circuit board further defines one of printed circuit board holes, voids, and slots.

According to another embodiment of the present invention, a controller for use in an electric machine including a rotor and a stator is provided. The controller is adapted for controlling the electromagnetic coil. The controller includes a plurality of electrical components and an isolation member. The isolation member includes a first portion positioned in a first direction between two adjacent electrical components of the plurality of electrical components and includes a second portion positioned in a second direction normal to the first direction.

According to another aspect of the present invention, the controller may be provided wherein the two adjacent electrical components of the plurality of electrical components are bulk capacitors.

According to another aspect of the present invention, the controller may be provided wherein the controller further includes a circuit board, wherein the two adjacent electrical components of the plurality of electrical components are positioned above one surface of the circuit board, and wherein the second portion is positioned between the two adjacent electrical components and the circuit board.

According to another aspect of the present invention, the controller may be provided wherein the controller further includes a circuit board, wherein the two adjacent electrical components of the plurality of electrical components are positioned above one surface of the circuit board, and wherein the second portion is position adjacent the two adjacent electrical components of the plurality of electrical components and opposed to the circuit board.

According to another aspect of the present invention, the controller may be provided the isolation member is integral.

According to another aspect of the present invention, the controller may be provided wherein the isolation member comprises mylar tape.

According to another aspect of the present invention, the controller may be provided wherein the isolation member comprises at least one of tape, sleeving, and mylar.

According to another aspect of the present invention, the controller may be provided wherein the controller further includes a circuit board and wherein the circuit board further defines one of printed circuit board holes, voids, and slots.

According to another embodiment of the present invention, a method for insulating a controller for use in an electrical machine is provided. The method includes the steps of providing a controller including a plurality of electrical components and a circuit board, positioning a first portion of an isolation member between two of the plurality of electrical components, and positioning a second portion of the isolation member between at least one of two of the plurality of electrical components and the circuit board.

According to another aspect of the present invention, the method may further include the step of positioning a second portion of the isolation member adjacent at least one of two of the plurality of electrical components and opposed to the circuit board.

DETAILED DESCRIPTION OF THE INVENTION

Electric machines, typically in the form of electric motors and electric generators, either separately or as a part of a larger device or system, are preferably made as small as possible for a variety of reasons, whether stationary or portable and whether fixed or in a vehicle.

Many modern electric machines include a control, for controlling the motor. The control may control the speed and direction of the motor by, for example, controlling the electrical energy going to the coils. The control typically includes a plurality of electrical components.

The embodiments described herein relate generally to an electric machine, and more specifically, to an electric machine with closely packed electronic components.

The electric machine typically includes a housing for containing and supporting the stator. While the electrical components may be positioned in a separate control, spaced from the housing of the electric machine, typically, to reduce cost, to reduce space requirements or for other reasons, at least a portion of the electrical components are positioned within the electric machine housing.

Typically, to reduce cost, to reduce space requirements or for other reasons, the electric components are positioned as close as possible to each other, whether positioned inside the electric machine housing or in a separate controls housing. Minimum spacings between adjacent electrical components are required for a variety of factors and the minimum spacings are regulated by a variety of industry and governmental agencies. The required minimum spacings and the number of components in the electric machine limit the minimize size of the housing for a given electric machine output capacity. Reducing these minimum spacings is desirable.

Technical effects of the methods, systems, and apparatus described herein include at least one of reduced electric machine size, reduced control size, improved serviceability, improved performance and quality and reduced labor costs.

Figure 1:
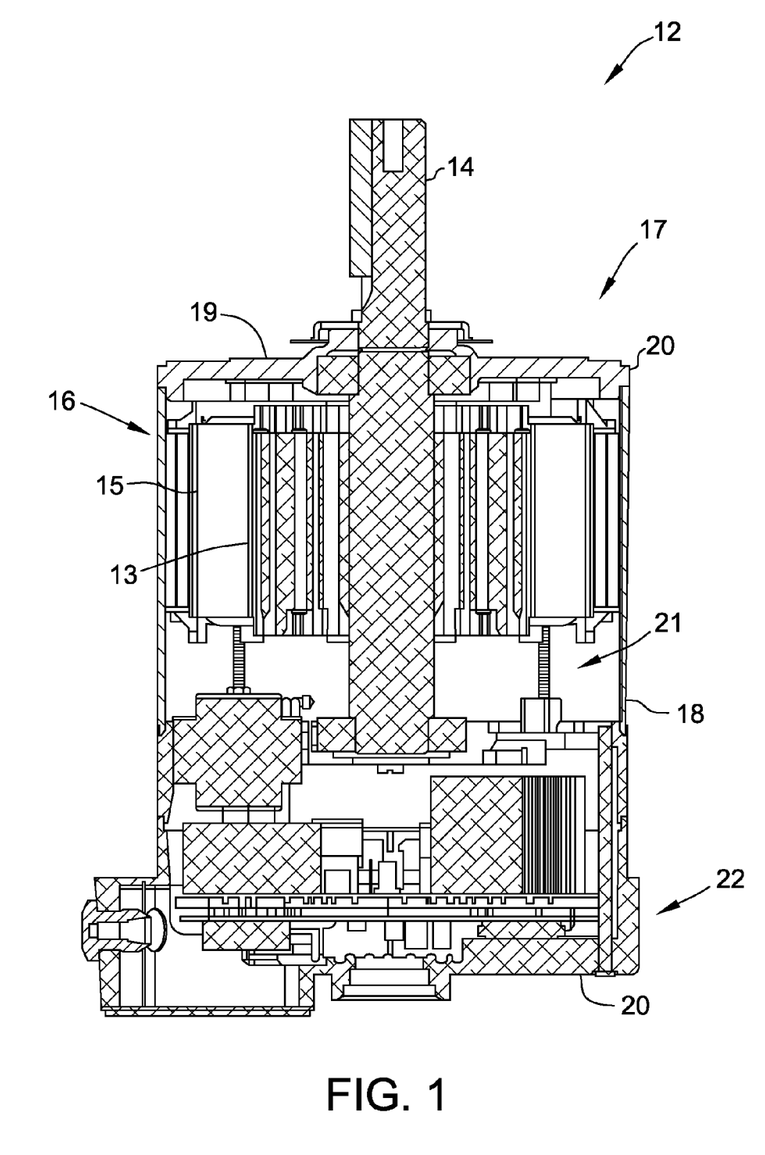
FIG. 1 is a perspective view of an embodiment of the present invention in the form of an electric machine.

According to an embodiment of the present invention and referring to FIG. 1, an electric machine 12 is provided. The electric machine 12 may be an electric motor or an electric generator, but hereinafter will be described as an electric motor 12. It should be appreciated that the electric motor may be used to power any mechanism, for example, a pump, a cyclic drive, a compressor, a vehicle, a fan or a blower.

The electric motor 12 typically includes a centrally located motor shaft 14 that rotates relative to the motor 12. Electrical energy is applied to coils 15 within the motor 12. The coils generate an electromagnetic field that cooperates with an electromagnetic field in rotor 13 mounted to the motor shaft 14. The coils 15 initiate relative motion between the shaft 14 and the motor 12 that transfers the power from the coils to the shaft 14.

A stationary assembly 16, also referred to as a stator, includes the stator core and coils 15 or windings positioned around portions of the stator core. It is these coils to which energy is applied to initiate this relative motion which transfers the power to the shaft. These coils 15 are formed by winding wire (not shown), typically copper, aluminum or a combination thereof, about a central core to form the winding or coil. An electric current is directed through the coils 15 which induces a magnetic field. It is the magnetic field that initiates this relative motion which transfers the power to the shaft 14.

Typically the motor 12 includes a housing 17 and defines a motor cavity 21 therein. The housing 17 may include a plurality of components and may be made of a suitable durable material, for example a metal, a polymer or a composite. The housing 17 may, as shown, include a cylindrical shell 18 and opposed end caps 20. The shaft 14 extends outwardly from an end 19 of the electric motor 12, typically from one of the end caps 20. The motor 12 may have any suitable size and shape and may be, for example, an induction motor, a permanent-split capacitor (PSC) motor, an electronically commutated motor (ECM) motor, or a switched reluctance motor. The housing 17 may include protrusions, for example fins (not shown), for dissipation of heat. The motor 12 may also include a fan (not shown) positioned within housing 17. The motor 12 may be a motor of any suitable size and power rating.

As shown in FIG. 1, the electric motor 12 further includes a controller 22. The controller 22 is adapted to control the electromagnetic coil 15. Note that the controller may operate independently or be in a slave or master relationship with another controller (not shown) that assists in controlling the motor 12 and/or coils 15. The controller 22 further includes a plurality of electrical components 24.

To prevent and/or minimize current and/or signal migration between the plurality of electrical components 24, private, governmental and quasigovernmental organizations provide standards for the minimum distances between adjacent electrical components. Underwriters Laboratories UL Corporate Headquarters U.S.A., 333 Pfingsten Road, Northbrook, Ill. 60062-2096 is one such organization. Similar organizations exist throughout the world to provide guidance for and approval of electrical circuitry layouts. Such minimum spacings between components are governed by minimum board level creepage clearances and air voltage/ground clearance.

Figure 2:
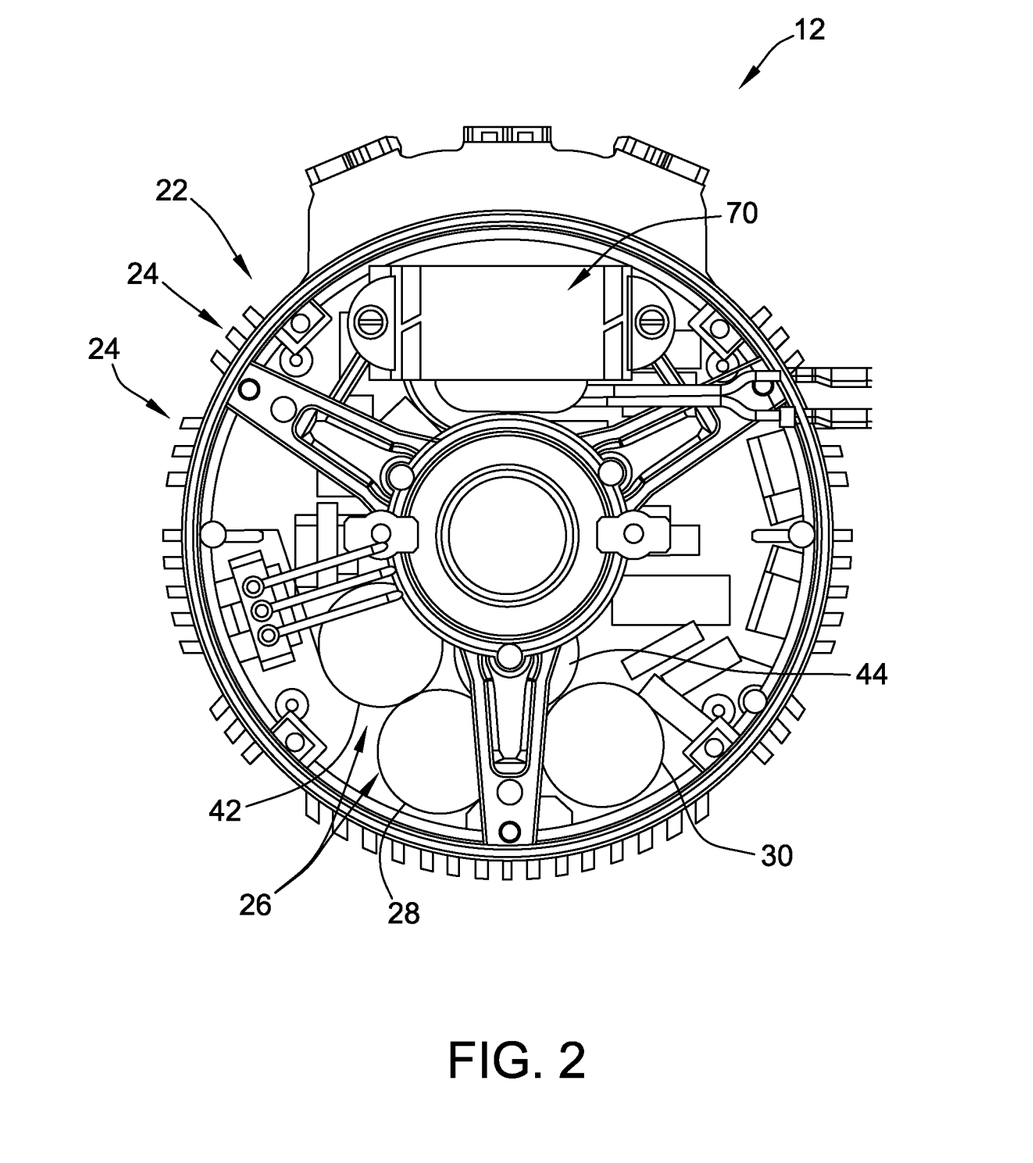
FIG. 2 is a end view of the electric machine of FIG. 1.
Figure 3:
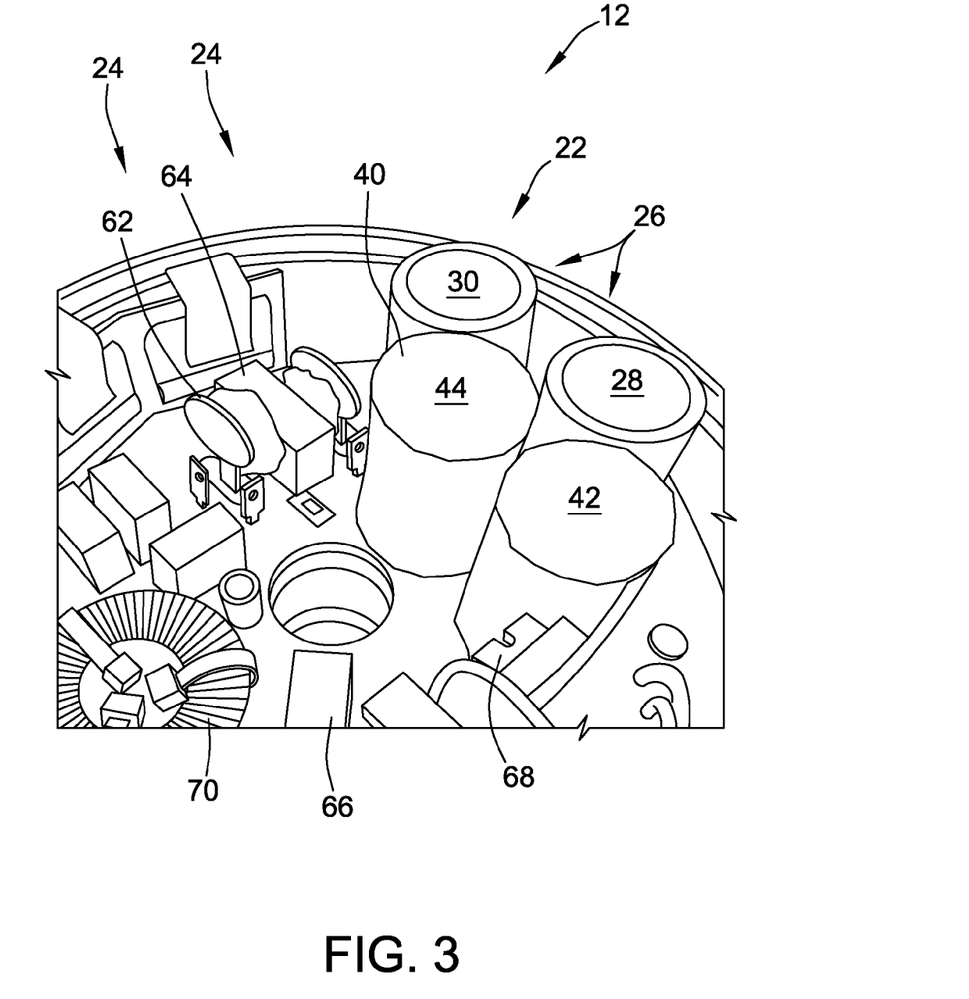
FIG. 3 is a partial perspective view of the electric machine of FIG. 1.
Figure 4:
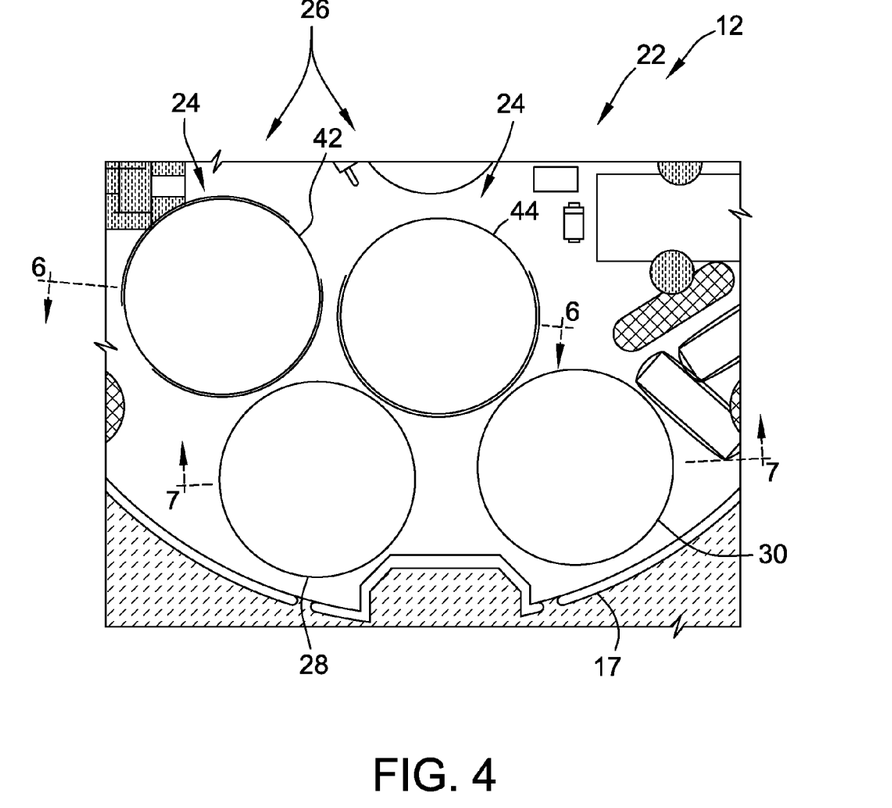
FIG. 4 is a partial end view of the electric machine of FIG. 3 showing two electrical components with isolation members according to an embodiment of the present invention.

According to an embodiment of the present invention and as shown in FIGS. 2-4, the electric motor 12 further includes an isolation member 26 to permit closer spacings between components than would otherwise be possible.

Figure 5:
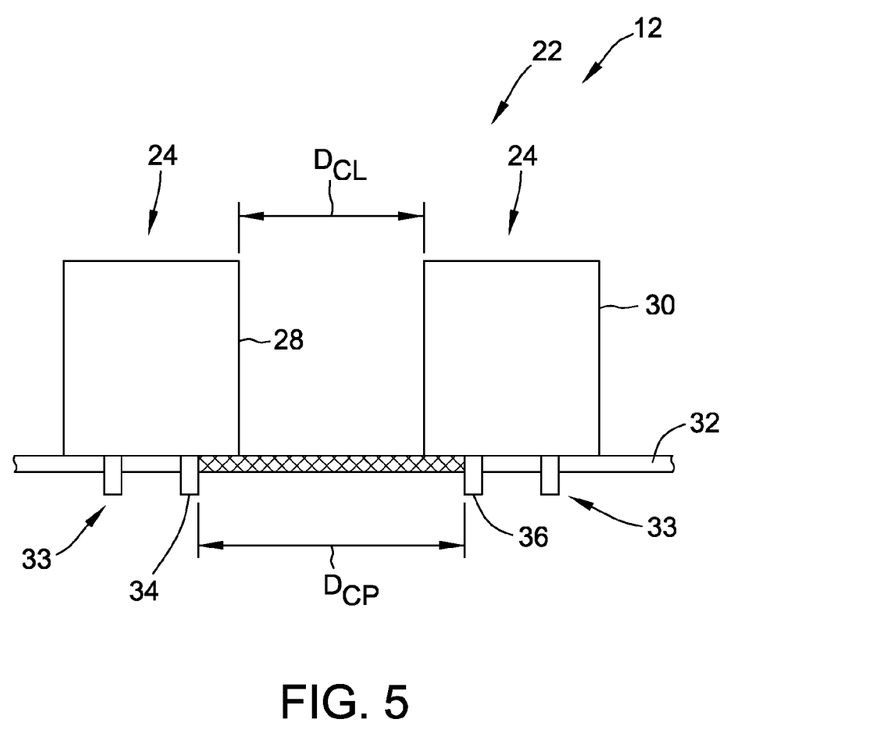
FIG. 5 is a cross sectional view of the component of FIG. 4 along the line 5-5 in the direction of the arrows.
Figure 6:
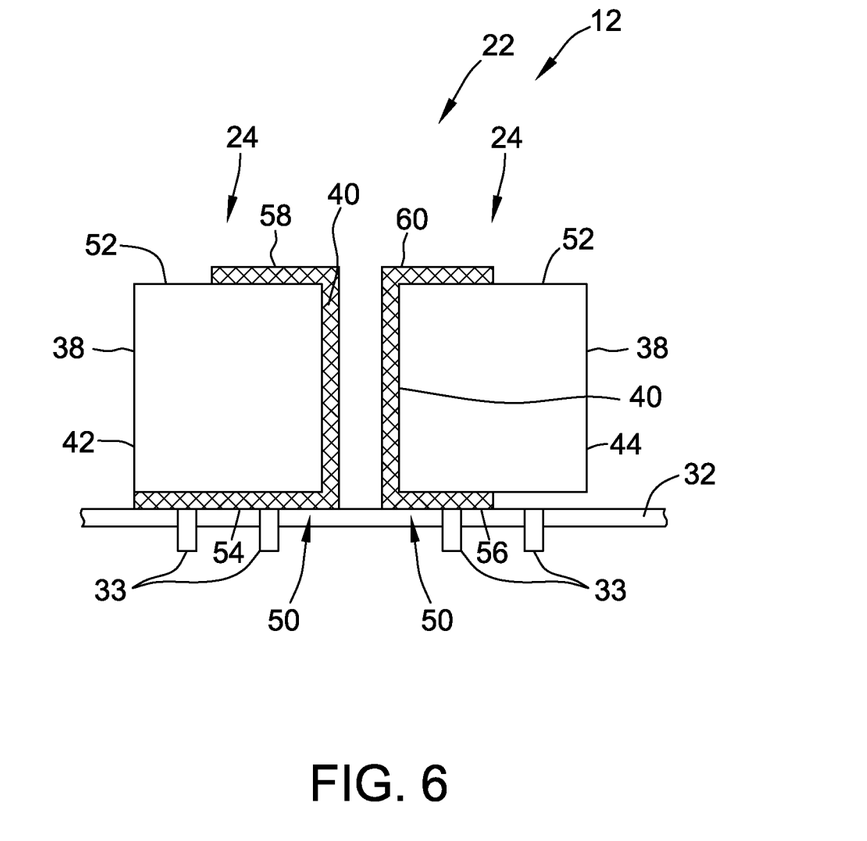
FIG. 6 is a cross sectional view of the component of FIG. 4 along the line 6-6 in the direction of the arrows.

Referring now to FIGS. 5-6, the standards for the minimum distances between adjacent electrical components set by private, governmental and quasigovernmental organizations or agencies are based on avoiding current leakage in a support structure for supporting the electrical components, typically a nonconductive plate in the form of a printed circuit board (PCB) and on avoiding current leakage in the air between adjacent electrical components.

As shown in FIG. 5, the controller 22 includes two electrical components 24 in the form of first bulk capacitor 28 and second bulk capacitor 30. The bulk capacitors 28 and 30 are supported on a support structure for supporting the electrical components, typically a nonconductive plate in the form of a printed circuit board (PCB) 32. The first bulk capacitor 28 has pins 33 including a negative pin 34 and the second bulk capacitor 28 has pins 33 including a positive pin 36. The distance between the negative pin 34 of the first bulk capacitor 28 and the positive pin 36 of the second bulk capacitor 30 defines a creepage distance $D_{CP}$. The distance between the first bulk capacitor 28 and the second bulk capacitor 30 defines a clearance distance $D_{CL}$. $D_{CP}$ and $D_{CL}$, both have a minimum distance.

The minimum creepage distance $D_{CP}$ is determined by current leakage through the PCB 32. Since materials used to make the PCB are highly insulative, the current leakage through the PCB 32 is minimal and thus the minimum creepage distance $D_{CP}$, which is based on operational voltages and determined by the the agencies, does not typically limit the spacing between electrical components 24. When needed to be reduced, the minimum creepage distance $D_{CP}$ can be reduced by potting the control.

The minimum clearance distance $D_{CL}$ is determined by current leakage through air. Since air may be more conductive than materials to make the PCBs, the current leakage through air is typically greater than that through the PCB 32. Thus, the minimum clearance distance $D_{CL}$, which is based on operational voltages and determined by the agencies, typically limits the spacing between electrical components 24.

These minimum distances limit the amount and size of electrical components 24 in a given size controller 22. The smaller these minimum distances, the smaller the controller. When the controller 22 is positioned within the housing 17 of the motor, the size of the controller 22 is very important in providing a motor 12 that is compact. Minimizing these minimum distances may be helpful in providing more compact controllers 22. Since the minimum creepage distance $D_{CP}$ typically is much less than the minimum clearance distance $D_{CL}$, reducing the minimum clearance distance $D_{CL}$ is a more fruitful way of providing more densely packed electrical components 24 and thus a smaller controller.

Minimum clearance distance $D_{CL}$ is defined as the distance over air between the voltage, ground or opposite polarities of electrical components 24. As shown in FIGS. 5 and 6, the clearance distance $D_{CL}$ is the minimum distance between peripheries 38 of the first bulk capacitor 28 and the second bulk capacitor 30.

As shown in FIG. 6 and according to an embodiment of the present invention, electrical isolation material 40 may be applied to the peripheries 38 of the electrical components 24 to reduce the minimum clearance distance $D_{CL}$. This reduction in minimum, clearance distance $D_{CL}$, is possible because the electrical isolation material 40 servers to reduce the current leakage through air between the peripheries 38 of the electrical components 24, since the electrical isolation material 40 reduces the current leakage that may leak from the peripheries 38 of the electrical components 24.

As shown in FIG. 6 and according to an aspect of the present invention, the electrical isolation material 40 is applied to third bulk capacitor 42 and to fourth bulk capacitor 44. As shown the electrical isolation material on third bulk capacitor 42 includes a circumferential portion 46. As shown the electrical isolation material on fourth bulk capacitor 44 also includes a circumferential portion 48. The circumferential portions 46 and 48 of the electrical isolation material 40 serve to reduce the current leakage through air between the peripheries 38 of the electrical components 24. However, since the lower faces 50 of the bulk capacitors 42 and 44 and the upper faces 52 of the bulk capacitors 42 and 44 also provide for current leakage through air, the circumferential portions 46 and 48 of the electrical isolation material 40 by themselves only slightly reduce current leakage through air and by themselves only slightly reduce the minimum clearance distance $D_{CL}$.

Thus, according to an aspect of the present invention, lower portions 54 and 56 of the electrical isolation material 40 are applied to the lower faces 50 of the bulk capacitors 42 and 44, respectively, and top portions 58 and 60 of the electrical isolation material 40 are applied to the upper faces 52 of the bulk capacitors 42 and 44, respectively. The lower portions 54 and 56, the top portions 58 and 60 and the circumferential portions 46 and 48 of the electrical isolation material 40 serve to significantly reduce current leakage through air and significantly reduce the minimum clearance distance $D_{CL}$, permitting the bulk capacitors 42 and 44 to be significantly more closely positioned and permitting a significantly smaller controller.

It should be appreciated that the lower portions 54 and 56, the top portions 58 and 60 and the circumferential portions 46 and 48 of the electrical isolation material 40 may completely or may only partially cover the peripheries 38 of the electrical components 24.

It should be appreciated that the lower portions 54 and 56, the top portions 58 and 60 and the circumferential portions 46 and 48 of the electrical isolation material 40 may be integral, or each portion may be a separate component.

It should be appreciated that the lower portions 54 and 56, the top portions 58 and 60 and the circumferential portions 46 and 48 of the electrical isolation material 40 may be in the form of electrically isolating tape.

It should be appreciated that the lower portions 54 and 56, the top portions 58 and 60 and the circumferential portions 46 and 48 of the electrical isolation material 40 may be in the form of tape, sleeving, and mylar. The electrical isolation material 40 may be applied as a coating or by adhesives, mechanical connectors, etc.

It should be appreciated that the lower portions 54 and 56, the top portions 58 and 60 and the circumferential portions 46 and 48 of the electrical isolation material 40 may be made of any suitable electrically non conductive material and may, for example, be made of a polymer or a composite.

It should be appreciated that the PCB 32 may further define PCB holes, voids, and/or slots (not shown). Such PCB holes, voids, and/or slots may further reduce current leakage and permit further reductions in clearance distance $D_{CL}$ and creepage distance $D_{CP}$. The further reductions in clearance distance $D_{CL}$ and creepage distance $D_{CP}$ may permit electrical components 24 to be significantly more closely positioned, which may result in a significantly smaller controller 22.

Referring again to FIGS. 2-4, the controller 22 of the electric motor 12 is shown in greater detail. The controller 22 includes a plurality of electrical components 24. Each of the electrical components 24 provides current leakage that contributes to clearance distance $D_{CL}$, and creepage distance $D_{CP}$. It should be appreciated that certain electrical components 24 may provide greater current leakage and more greatly contribute to clearance distance $D_{CL}$ and creepage distance $D_{CP}$. For those certain electrical components 24, the use of electrical isolation material 40 may be more beneficial.

For example and as shown in FIGS. 2-4, the third bulk capacitor 42 and to fourth bulk capacitor 44 utilize the electrical isolation material 40. As shown in FIGS. 2-4, other electrical components 24 may not benefit greatly from the use of the electrical isolation material 40 and the electrical isolation material 40 may not be required on them.

As shown in FIG. 3, the electrical isolation material 40 may be applied to other components that generate significant leakage current, for example metal oxide varistor (MOV) 62, thermistor 64, X-capacitor 66, flyback transformer 68 and choke 70. It should be appreciated that for improved results the electrical isolation material 40 may be applied to the top and bottom, as well as the sides of the electrical components 24. It should be appreciated that for improved results, the electrical isolation material 40 may be applied to surfaces that are adjacent external surfaces of the controller 22 or the housing 17 where leakage current may be important.

Figure 7:
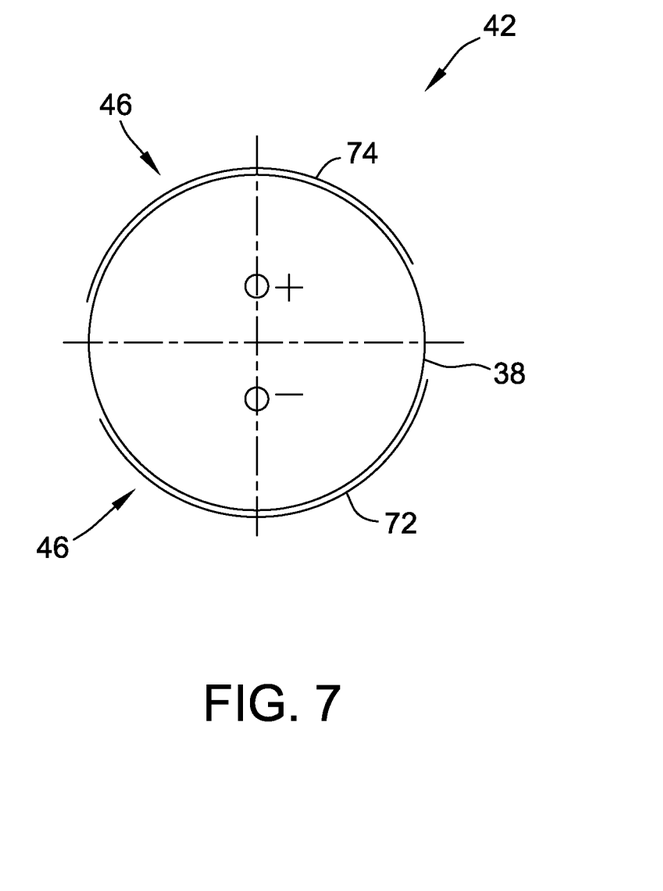
FIG. 7 is a top view of a one of the two electric components of FIG. 4.
Figure 8:
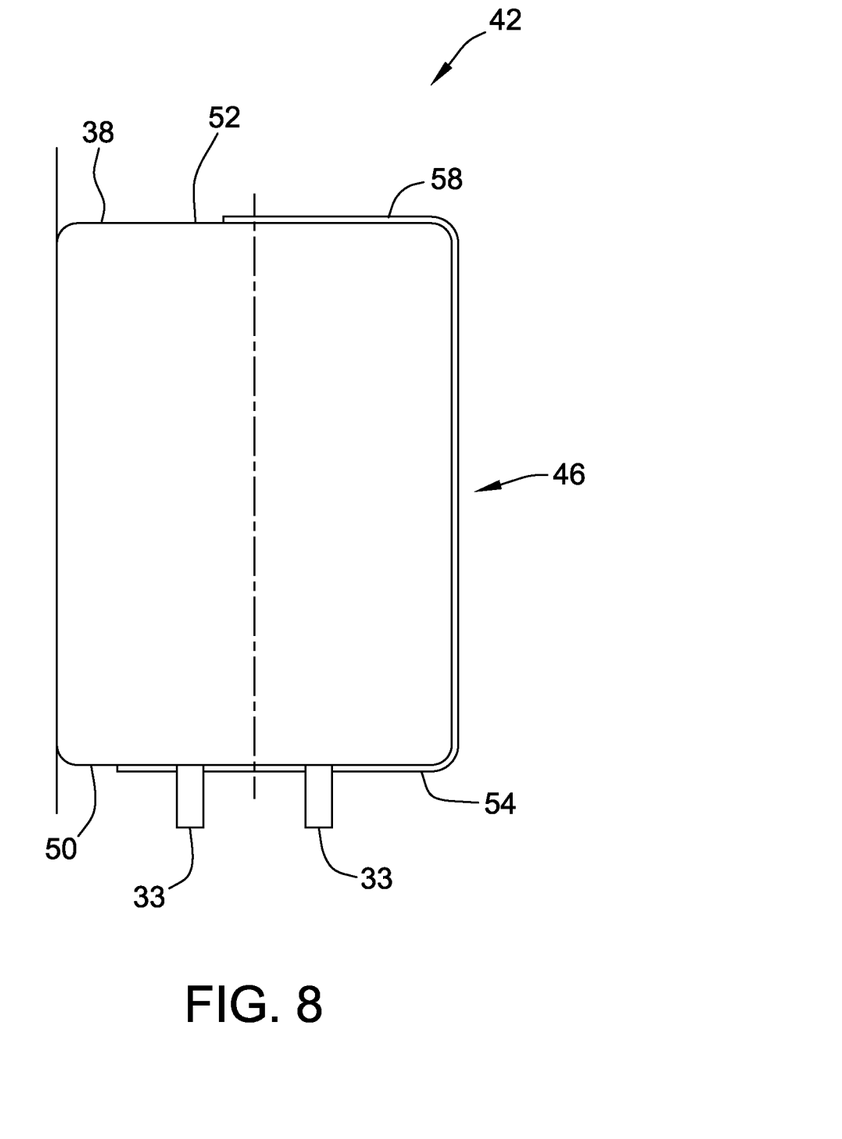
FIG. 8 is a plan view of the two electric components of FIG. 7.

Referring now to FIGS. 7 and 8, the third bulk capacitor 42 includes circumferential portion 46. As shown, the circumferential portion 46 has two sections 72 and 74. The sections 72 and 74 are selected to correspond to locations in the controller 22 where adjacent electrical components 24 or other features cause the leakage current to be more important. It should be appreciated that the entire circumferential surface of the third bulk capacitor 42 may be covered with the electrical isolation material 40. The use of electrical isolation material 40 only where needed/beneficial is preferred.

As shown, the third bulk capacitor 42 includes an upper portion 58 and a lower portion 54 adjacent the pins 33. The upper portion 58 and the lower portion 54 may, as shown, cover only a portion of the respective upper and lower portions of the third bulk capacitor 42. The covered portions are selected to correspond to locations in the controller 22 where adjacent electrical components 24 or other features cause the leakage current to be more important. It should be appreciated that the entire upper and lower surfaces of the third bulk capacitor 42 may be covered with the electrical isolation material 40. The use of electrical isolation material 40 only where needed/beneficial is preferred.

Figure 9:
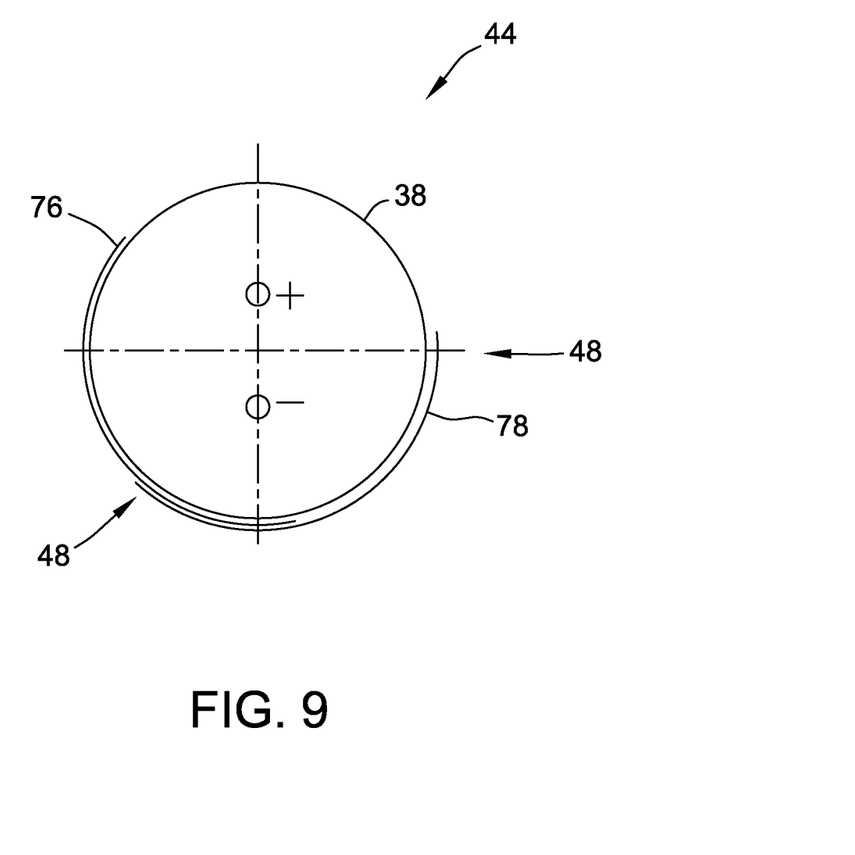
FIG. 9 is a top view of the other of the two electric components of FIG. 4.
Figure 10:
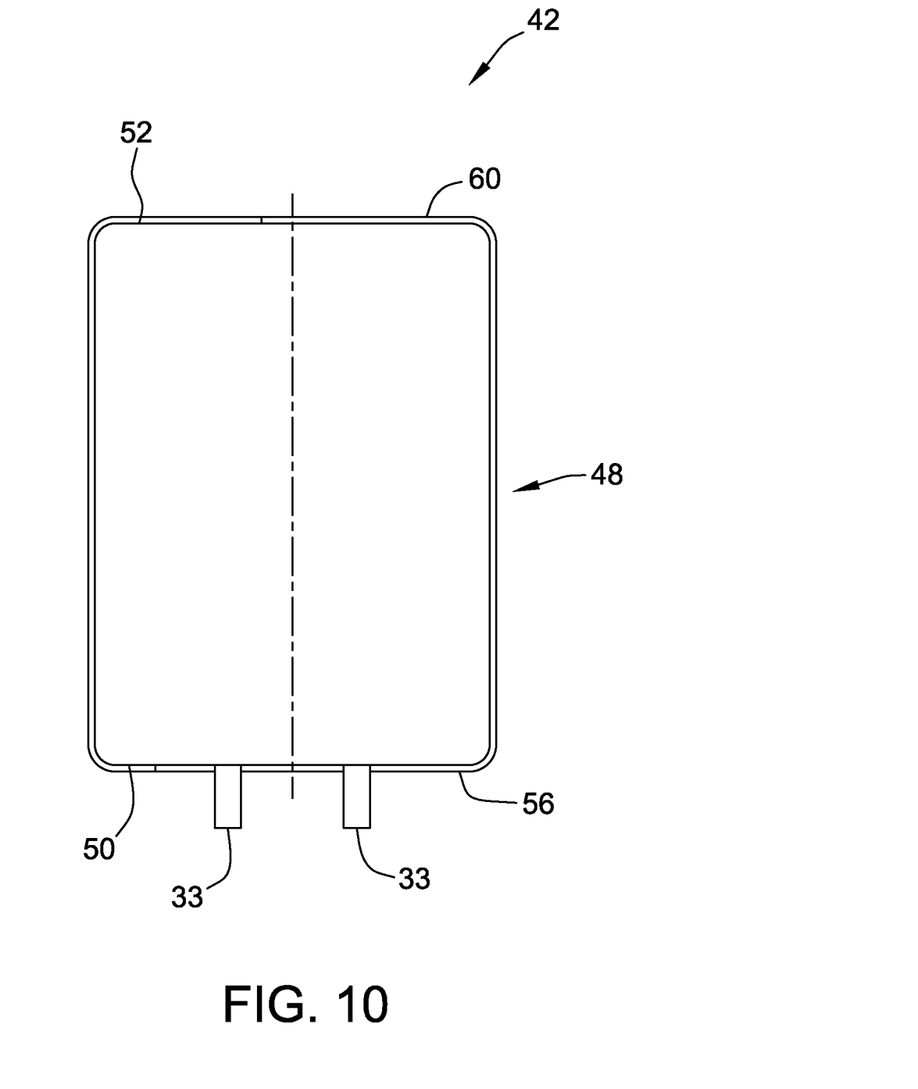
FIG. 10 is a plan view of the two electric components of FIG. 9.

Referring now to FIGS. 9 and 10, the fourth bulk capacitor 44 includes a circumferential portion 48. As shown, the circumferential portion 48 has two sections 76 and 78. The sections 76 and 78 are selected to correspond to locations in the controller 22 where adjacent electrical components 24 or other features cause the leakage current to be more important. As shown, the sections 76 and 78 overlap so that a portion of the circumferential portion 48 is covered by both the section 76 and the section 78. It should be appreciated that the entire circumferential surface of the fourth bulk capacitor 44 may be covered with the electrical isolation material 40. The use of electrical isolation material 40 only where needed/beneficial is preferred.

As shown the fourth bulk capacitor 44 includes an upper portion 60 and a lower portion 56 adjacent the pins 33. The upper portion 60 and the lower portion 56 may as shown cover only a portion of the respective upper and lower portions of the third bulk capacitor 42. The covered portions are selected to correspond to locations in the controller 22 where adjacent electrical components 24 or other features cause the leakage current to be more important. It should be appreciated that the entire upper and lower surfaces of the third bulk capacitor 42 may be covered with the electrical isolation material 40. The use of electrical isolation material 40 only where needed/beneficial is preferred.

Figure 11:
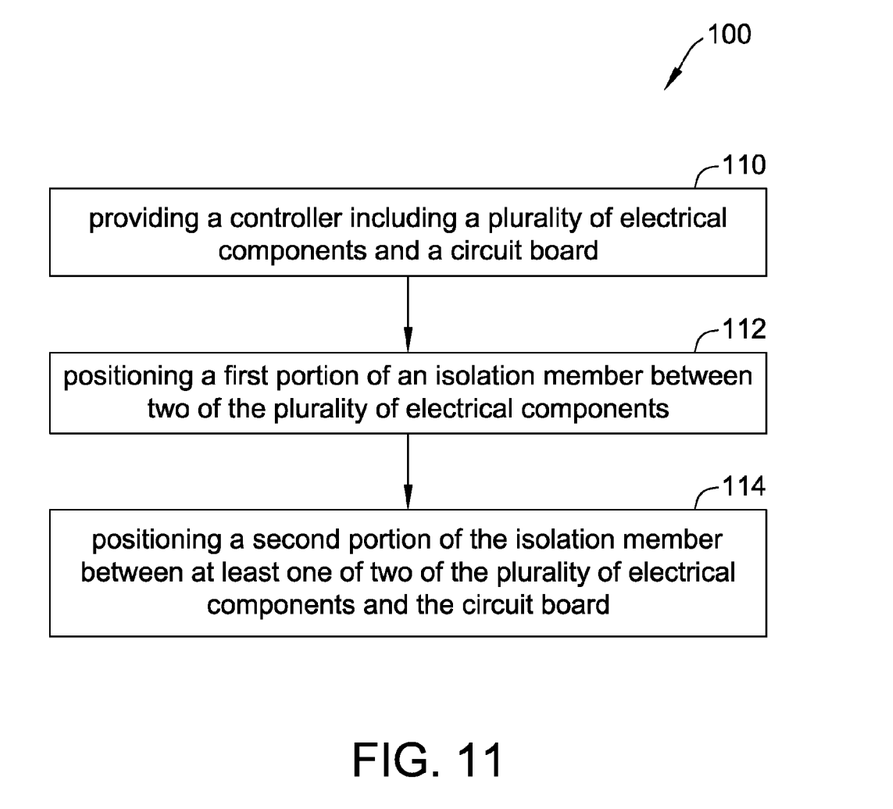
FIG. 11 is a flow chart of another embodiment of the present invention in the form of a method for providing an electric machine.

According to another embodiment of the present invention and referring now to FIG. 11, a method 100 for method for insulating a controller for use in an electrical machine is provided. The method 100 includes step 110 of providing a controller including a plurality of electrical components and a circuit board and step 112 of positioning a first portion of an isolation member between two of the plurality of electrical components. The method 100 also includes step 114 of positioning a second portion of the isolation member between at least one of two of the plurality of electrical components and the circuit board.

It should be appreciated that the method 100 may further include the step of positioning a second portion of the isolation member adjacent at least one of two of the plurality of electrical components and opposed to the circuit board.

The methods, systems, and apparatus described herein facilitate efficient and economical assembly of an electric machine. Exemplary embodiments of methods, systems, and apparatus are described and/or illustrated herein in detail.

The methods, systems, and apparatus are not limited to the specific embodiments described herein, but rather, components of each apparatus and system, as well as steps of each method, may be utilized independently and separately from other components and steps described herein. Each component, and each method step, can also be used in combination with other components and/or method steps.

When introducing elements/components/etc, of the methods and apparatus described and/or illustrated herein, the articles "a", "an", "the", and "the" are intended to mean that there are one or more of the element(s)/component(s)/etc. The terms "comprising", "including", and "having" are intended to be inclusive and mean that there may be additional element(s)/component(s)/etc. other than the listed element(s)/component(s)/etc.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Described herein are exemplary methods, systems and apparatus utilizing lower cost materials in a permanent magnet machine that reduces or eliminates the efficiency loss caused by the lower cost material. Furthermore, the exemplary methods system and apparatus achieve increased efficiency while reducing or eliminating an increase of the length of the machine. The methods, system and apparatus described herein may be used in any suitable application. However, they are particularly suited for IP/AC and pump applications.

Exemplary embodiments of the fluid flow device and system are described above in detail. The electric machine and its components are not limited to the specific embodiments described herein, but rather, components of the systems may be utilized independently and separately from other components described herein. For example, the components may also be used in combination with other machine systems, methods, and apparatuses, and are not limited to practice with only the systems and apparatus as described herein. Rather, the exemplary embodiments can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electric machine, comprising:
a stator including an electromagnetic coil;
a rotor, said rotor configured to rotate relative to said stator; and
a controller for controlling the electromagnetic coil, said controller including:
a board;
a first bulk capacitor mounted to said board;
a second bulk capacitor mounted to said board, said first bulk capacitor defining a first bulk capacitor exterior surface thereof, said second bulk capacitor defining a second bulk capacitor exterior surface thereof, the first bulk capacitor exterior surface and the surface bulk capacitor exterior surface defining a space therebetween; and
a first isolation member, said first isolation member connected to said first bulk capacitor and positioned in the space between said first bulk capacitor said and second bulk capacitor.

2. The electric machine as in claim 1, further comprising a second isolation member, said second isolation member connected to said first bulk capacitor and positioned in the space between said first bulk capacitor said and second bulk capacitor.

3. The electric machine as in claim 1:
wherein said first bulk capacitor is cylindrically shaped, defining a cylindrical peripheral surface and first and second planar external surfaces extending from opposed distal ends of the cylindrical peripheral surface; and
wherein said second bulk capacitor is cylindrically shaped, defining a cylindrical peripheral surface and first and second planar external surfaces extending from opposed distal ends of the cylindrical peripheral surface.

4. The electric machine as in claim 3:
wherein the cylindrical peripheral surface of said first bulk capacitor defines the first bulk capacitor exterior surface; and
wherein the cylindrical peripheral surface of said second bulk capacitor defines the second bulk capacitor exterior surface.

5. The electric machine as in claim 3:
wherein the first planar exterior surface of said first bulk capacitor is positioned adjacent said board; and
wherein the first planar exterior surface of said second bulk capacitor is positioned adjacent said board.

6. The electric machine as in claim 5, further comprising a second isolation member, said second isolation member connected to said first bulk capacitor and positioned in the space between said first bulk capacitor said and second bulk capacitor.

7. The electric machine as in claim 6, further comprising a third isolation member positioned on at least a portion of the first planar exterior surface of said first bulk capacitor.

8. The electric machine as in claim 7, further comprising a fourth isolation member positioned on at least a portion of the second planar exterior surface of said first bulk capacitor.

9. The electric machine as in claim 8, further comprising:
a fifth isolation member positioned on at least a portion of the first planar exterior surface of said second bulk capacitor; and
a sixth isolation member positioned on at least a portion of the second planar exterior surface of said second bulk capacitor.

10. A controller for use in an electric machine including a rotor and a stator, said controller including:
- a board;
- a first bulk capacitor mounted to said board;
- a second bulk capacitor mounted to said board, said first bulk capacitor defining a first bulk capacitor exterior surface thereof, said second bulk capacitor defining a second bulk capacitor exterior surface thereof, the first bulk capacitor exterior surface and the surface bulk capacitor exterior surface defining a space therebetween; and
- a first isolation member, said first isolation member connected to said first bulk capacitor and positioned in the space between said first bulk capacitor said and second bulk capacitor.

11. The controller as in claim 2:
- wherein said first bulk capacitor is cylindrically shaped, defining a cylindrical peripheral surface and first and second planar external surfaces extending from opposed distal ends of the cylindrical peripheral surface; and
- wherein said second bulk capacitor is cylindrically shaped, defining a cylindrical peripheral surface and first and second planar external surfaces extending from opposed distal ends of the cylindrical peripheral surface.

12. The controller as in claim 11:
- wherein the cylindrical peripheral surface of said first bulk capacitor defines the first bulk capacitor exterior surface; and
- wherein the cylindrical peripheral surface of said second bulk capacitor defines the second bulk capacitor exterior surface.

13. The controller as in claim 11:
- wherein the first planar exterior surface of said first bulk capacitor is positioned adjacent said board; and
- wherein the first planar exterior surface of said second bulk capacitor is positioned adjacent said board.

14. The controller as in claim 13, further comprising a second isolation member, said second isolation member connected to said first bulk capacitor and positioned in the space between said first bulk capacitor said and second bulk capacitor.

15. The controller as in claim 14, further comprising a third isolation member positioned on at least a portion of the first planar exterior surface of said first bulk capacitor.

16. The controller as in claim 15, further comprising a fourth isolation member positioned on at least a portion of the second planar exterior surface of said first bulk capacitor.

* * * * *